United States Patent
Kamali et al.

(10) Patent No.: US 9,658,921 B2
(45) Date of Patent: May 23, 2017

(54) MAXIMAL TRANSITION HAMMING CODES

(71) Applicant: SAMSUNG DISPLAY CO., LTD., Yongin, Gyeonggi-Do (KR)

(72) Inventors: Jalil Kamali, San Jose, CA (US); Ken Hu, Cupertino, CA (US)

(73) Assignee: Samsung Display Co., Ltd., Yongin-si (KR)

( * ) Notice: Subject to any disclaimer, the term of this patent is extended or adjusted under 35 U.S.C. 154(b) by 152 days.

(21) Appl. No.: 14/338,109

(22) Filed: Jul. 22, 2014

(65) Prior Publication Data
US 2015/0121164 A1    Apr. 30, 2015

Related U.S. Application Data

(60) Provisional application No. 61/898,415, filed on Oct. 31, 2013.

(51) Int. Cl.
| | |
|---|---|
| *G06F 11/10* | (2006.01) |
| *H03M 13/19* | (2006.01) |
| *H03M 13/31* | (2006.01) |

(52) U.S. Cl.
CPC ............. *G06F 11/10* (2013.01); *H03M 13/19* (2013.01); *H03M 13/31* (2013.01)

(58) Field of Classification Search
CPC .......................... G11B 20/00579; G06F 11/10
See application file for complete search history.

(56) References Cited

U.S. PATENT DOCUMENTS

| | | | | |
|---|---|---|---|---|
| 4,596,014 A | * | 6/1986 | Holeman ............... | G06F 11/004 714/800 |
| 6,404,355 B1 | * | 6/2002 | Coene ................... | H03M 5/145 341/58 |
| 2003/0192006 A1 | * | 10/2003 | Coakeley ............ | H03M 13/098 714/776 |

FOREIGN PATENT DOCUMENTS

| | | |
|---|---|---|
| KR | 10-2007-0112953 A | 11/2007 |
| KR | 10-2009-0009118 A | 1/2009 |
| KR | 10-2009-0022495 A | 3/2009 |

OTHER PUBLICATIONS

EPO Search Report dated Jan. 21, 2015, for corresponding European Patent application 14189177.0, (7 pages).

(Continued)

*Primary Examiner* — Steve Nguyen
(74) *Attorney, Agent, or Firm* — Lewis Roca Rothgerber Christie LLP

(57) ABSTRACT

An encoder includes: an input configured to receive a plurality of data bits; a processor configured to encode the data bits utilizing a Hamming encoding operation to generate a plurality of coded bits; and an output configured to output the plurality of coded bits, wherein the processor is configured to reduce a maximum run length of the plurality of coded bits in comparison to coded bits corresponding to standard Hamming code.

14 Claims, 14 Drawing Sheets

Odd parity     Even parity

(56) References Cited

OTHER PUBLICATIONS

Mira Da Fonseca, Carlos M., *Runlength Limited Error Control Codes: design, realisation and practical evaluation*, Project dissertation, University of Wales, Bangor, Jan. 1991, pp. 1-142, XP 055161886.
Popplewell A, et al. *Runlength limited binary error control codes*, IEE Proceedings-I, Solid-State & Electron Devices, Institution of Electrical Engineers, vol. 139, No. 3, Part 1, Jun. 1992, pp. 349-355, XP 000305100.
Farkas, P., et al, *Reed Muller-Codes With Run Length Properties*, Mobile Future 2004, and the Symposium on Trends in Communications. Sym Potic '04. Joint 1st Workshop on Bratislava, Slovakia, Oct. 24-26, 2004, IEEE, pp. 66-69, XP 010778508.

\* cited by examiner

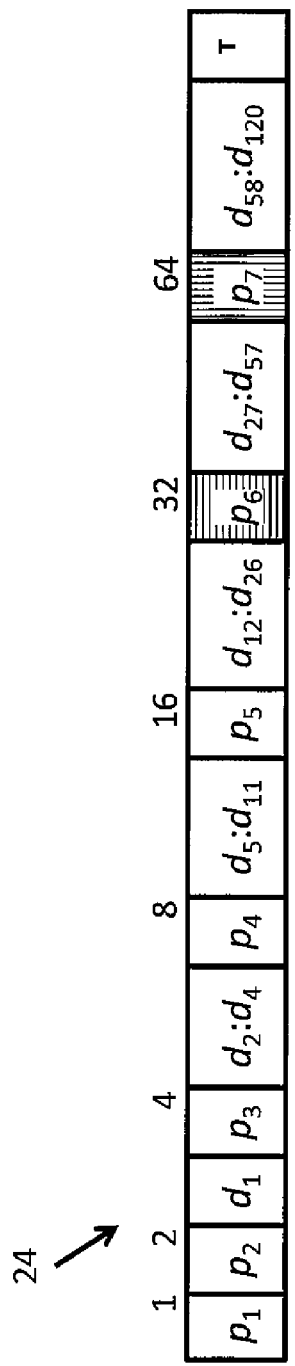
FIG. 8A
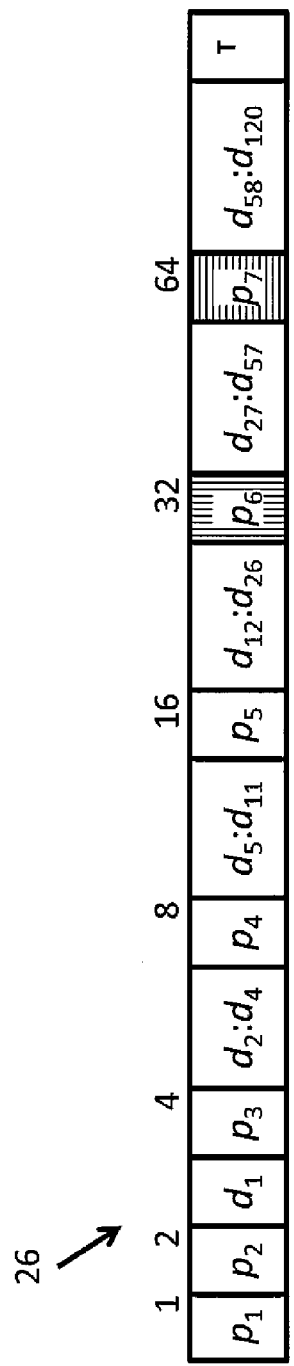
FIG. 8B

MAXIMAL TRANSITION HAMMING CODES

CROSS-REFERENCE TO RELATED APPLICATION(S)

This application claims priority to and the benefit of U.S. Provisional Patent Application No. 61/898,415 "Maximal Transition Hamming Codes," filed in the United States Patent and Trademark Office on Oct. 31, 2013, the entire disclosure of which is incorporated herein by reference.

BACKGROUND

In data communications, transmissions between a sender and a receiver can be verified and corrected using Hamming codes (HC). Generally speaking, a Hamming code provides error detection and correction for a plurality of data bits by including a plurality of parity bits, where the parity bits are intermingled among the data bits.

In addition, in electronic data communications such as in a serial data link, communications between a sender and a receiver may be synchronized using a clock recovery or clock-data recovery (CDR) process. For example, a receiver may generate a clock from an approximate frequency reference using a phase-locked loop (PLL), and then phase-align the generated signal to the transitions in the data stream using CDR. However, recovery of the clock signal can fail if the data run length (e.g., stream of consecutive 1s or 0s) exceeds a particular length due to there being an insufficient number of transitions for the receiver to detect.

SUMMARY

Aspects of embodiments of the present invention are directed to systems and methods for reducing or minimizing the run length of digital data. In some embodiments, a modified Hamming encoding operation is applied to the digital data.

According to one embodiment of the present invention, a method for encoding data includes: computing a plurality of parity bits using a Hamming encoding operation on a plurality of data bits, a first parity bit of the parity bits being computed using even party and a second parity bit of the parity bits being computed using odd parity; and outputting the data bits and the computed parity bits.

The second parity bit may be the last parity bit in sequence of the plurality of parity bits.

The first parity bit may be the second to the last parity bit in sequence of the plurality of parity bits.

The Hamming encoding operation may correspond to HC(127, 120), the first parity bit may be the 6th parity bit and the second parity bit may be the 7th parity bit.

According to one embodiment of the present invention, a method for encoding data includes: computing a plurality of parity bits utilizing a Hamming encoding operation on a plurality of data bits; interleaving the computed parity bits with the plurality of data bits to generate a plurality of coded data bits; and rearranging the plurality of coded data bits to reduce a maximum run length of a data sequence of the plurality of data bits.

The rearranging the plurality of coded data bits may include moving a number of the plurality of coded data bits at the beginning of the coded data bits to a position after a last one of the coded data bits.

The Hamming encoding operation may correspond to HC(127, 120), and the number of the plurality of coded data bits at the beginning may include 32 bits.

The Hamming encoding operation may utilize odd parity.

According to one embodiment of the present invention, an encoder includes: an input configured to receive a plurality of data bits; a processor configured to encode the data bits utilizing a Hamming encoding operation to generate a plurality of coded bits; and an output configured to output the plurality of coded bits, wherein the processor is configured to reduce a maximum run length of the plurality of coded bits in comparison to coded bits corresponding to standard Hamming code.

The processor may be configured to compute a plurality of parity bits utilizing the Hamming encoding operation on the plurality of data bits, a first parity bit of the parity bits being computed utilizing even parity and a second parity bit of the parity bits being computed utilizing odd parity, wherein the plurality of coded bits may include the data bits and the computed parity bits.

The processor may be configured to rearrange the plurality of coded bits to reduce the maximum run length of the plurality of coded bits.

The plurality of coded bits may be rearranged by moving a number of the plurality of coded bits at the beginning to a position after a last one of the coded bits.

The Hamming encoding operation may correspond to HC(127, 120), and the number of the plurality of coded bits at the beginning comprises 32 bits.

According to one embodiment of the present invention, a decoder includes: an input configured to receive a plurality of coded bits comprising a plurality of data bits and a plurality of parity bits; a processor configured to: modify received coded bits to generate a plurality of Hamming coded bits; and decode the Hamming coded bits utilizing a Hamming decoding operation to generate a plurality of decoded bits; and an output configured to output the plurality of decoded bits, wherein the received plurality of coded bits has a reduced run length in comparison to coded bits corresponding to standard Hamming code.

The processor may be configured to modify the received coded bits by rearranging the plurality of received coded bits by moving a number of the plurality of coded bits at the beginning to a position after a last one of the coded bits.

The processor may be configured to modify the received coded bits by toggling the value of a parity bit of the parity bits.

According to one embodiment of the present invention, a communication system includes: a data source; a serial link; an encoder coupled between the data source and the serial link, the encoder including: an input configured to receive a plurality of bits from the data source; a processor configured to encode the bits utilizing a Hamming encoding operation to generate a plurality of coded bits; and an output configured to output the plurality of coded bits to the serial link, wherein the processor is configured to reduce a maximum run length of the plurality of coded bits in comparison to coded bits corresponding to standard Hamming code.

The processor may be configured to compute a plurality of parity bits utilizing the Hamming encoding operation on the plurality of bits, a first parity bit of the parity bits being computed utilizing even parity and a second parity bit of the parity bits being computed utilizing odd parity, wherein the plurality of coded bits comprises the data bits and the computed parity bits.

The processor may be configured to rearrange the plurality of coded bits to reduce the maximum run length of the plurality of coded bits by moving a number of the plurality of coded bits at the beginning to a position after a last one of the coded bits.

BRIEF DESCRIPTION OF THE DRAWINGS

The accompanying drawings, together with the specification, illustrate example embodiments of the present invention, and, together with the description, serve to explain the principles of the present invention.

FIGS. 8A and 8B schematically illustrate data encoded using a modified Hamming code according to additional embodiments of the present invention.

DETAILED DESCRIPTION

Figure 1:
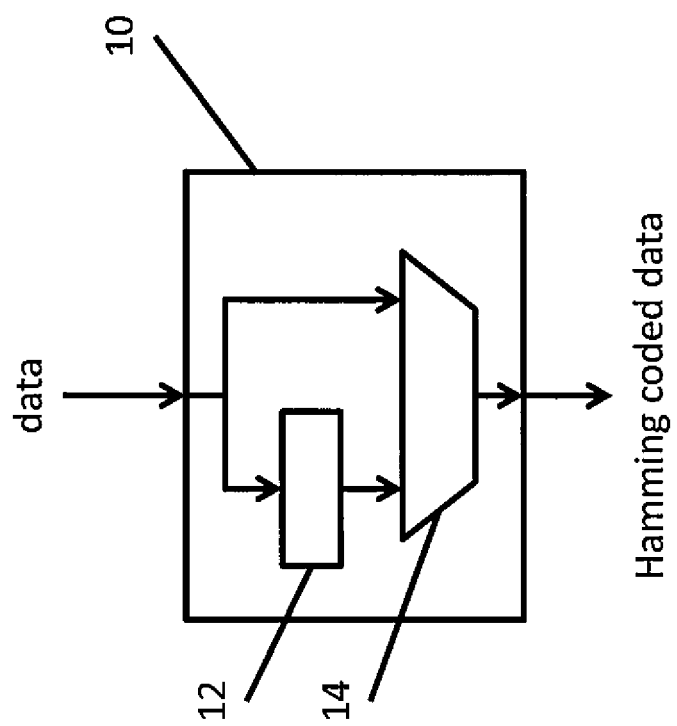
FIG. 1 is a schematic block diagram illustrating a component configured to receive input data and to generate Hamming coded data.

In the following detailed description, only certain example embodiments of the present invention are shown and described, by way of illustration. As those skilled in the art would recognize, the invention may be embodied in many different forms and should not be construed as being limited to the embodiments set forth herein. Like reference numerals designate like elements throughout the specification.

Aspects of embodiments of the present invention are directed to systems and methods for reducing or minimizing the run length of digital data in a communications system.

In digital communications, a sender and a receiver can be synchronized using a clock recovery or clock-data recovery (CDR) process. A receiver using a CDR process typically operates by detecting the time of transitions between voltage levels and phase-aligning the clock of the receiver based on the detected transitions.

However, if the received signal contains an excessively long run length (e.g., a long sequence of data symbols having the same voltage level), the CDR process can fail due to there being an insufficient number of transitions in the received signal, which can cause problems in the recovery of the clock.

In addition, in data communications in general, errors in transmissions between a sender and a receiver can be detected and corrected by coding the bit stream. One such coding technique is called Hamming Code (HC) which provides one bit error detection and correction for a plurality of data bits by including (or interleaving) a plurality of parity bits in the communication stream. In a standard Hamming code system, these parity bits are intermingled among the data bits.

FIG. 1 is a schematic block diagram illustrating a device 10 configured to compute Hamming codes. The device 10 includes a parity generator 12 and a multiplexer 14 that are configured to receive data bits via an input coupled to a data source. The parity generator 12 computes parity bits using a Hamming encoding operation on the data bits, and the multiplexer 14 combines the generated parity bits with the received data bits to generate Hamming coded data. The parity generator 12 may be an even parity generator or may be an odd parity generator. The multiplexer 14 may be, for example, a buffer configured to store the generated parity bits and the data bits before outputting the Hamming coded data to an output (e.g., a serial communications device coupled to a serial link).

The number of parity bits (M) depends on the number of data bits (N) in the bit stream. Specifically for N data bits, the number of parity bits M satisfies:

$$2^{M-1}-M+1 \leq N \leq 2^M-M-1, \text{ for } M=2,3, \quad (1)$$

Figure 2:
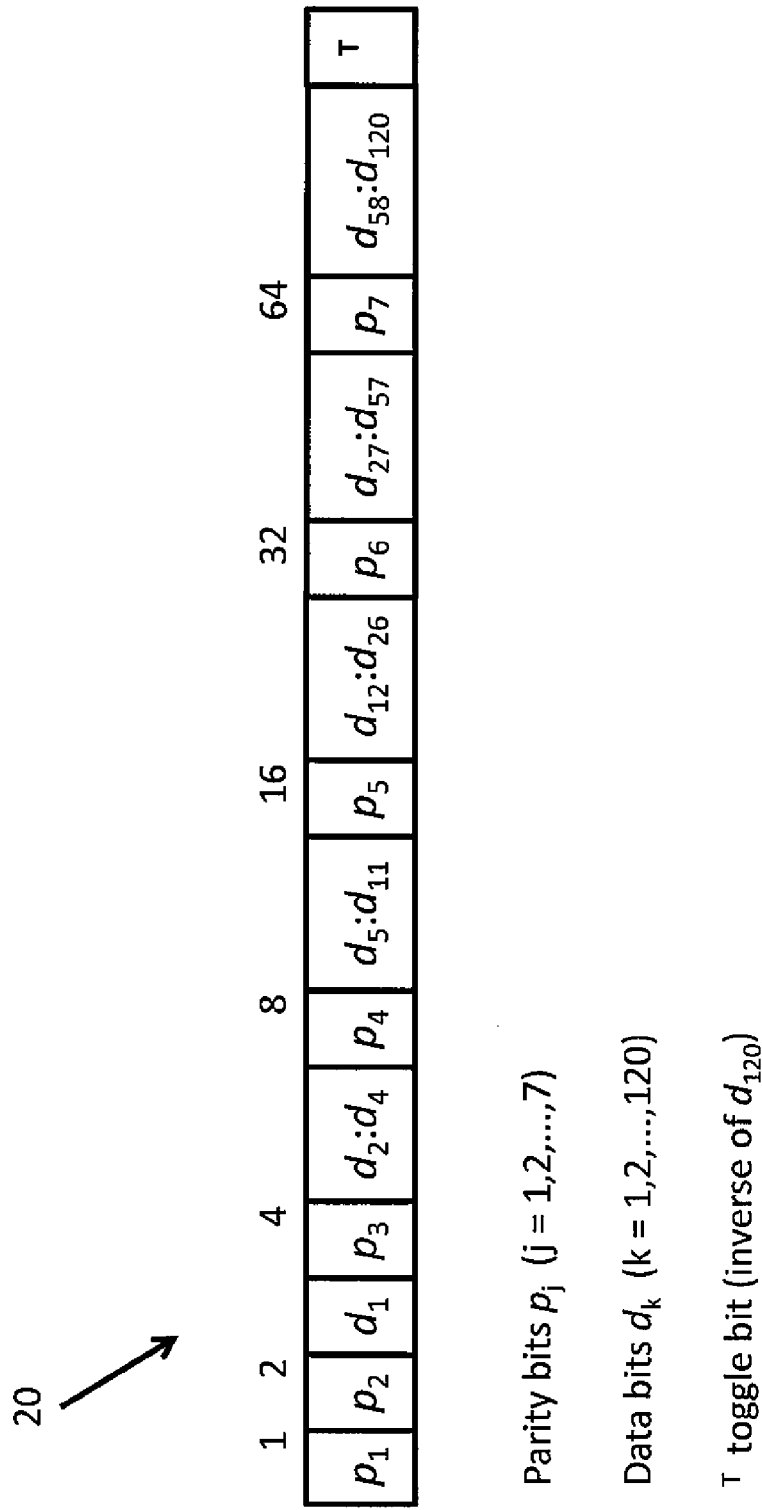
FIG. 2 schematically illustrates Hamming 120 data bits with 7 parity bits (or HC(127, 120).

FIG. 2 illustrates the encoding of one hundred twenty data bits through seven parity bits (referred to as HC(127, 120)). As shown in FIG. 2, the seven parity bits $p_j$ (where $j=1, 2, \ldots, 7$) are intermingled among the 120 data bits $d_k$ (where $k=1, 2, \ldots, 120$). In particular, in a standard Hamming code, the parity bits are located at positions that are powers of two. For example, as shown in FIG. 2, the parity bits are located at positions 1, 2, 4, 8, 16, 32, and 64 in the standard (127, 120) Hamming code 20. A toggle bit T (or $b_T$) may also be included at the end, where the toggle bit is the inverse of the last bit. For example, in a HC(127, 120), if $d_{120}=0$, then T=1 and if $d_{120}=1$, then $b_T=0$.

In a Hamming encoding operation, each of the parity bits is computed based on an XOR operation on a particular set of the data bits. For instance, $p_1$ can be computed from an XOR operation on every other bit in the bit stream as follows.

$$p_1 \oplus d_1 \oplus d_2 \oplus d_4 \oplus d_5 \oplus d_7 \ldots = f$$

where $\oplus$ is the XOR operation and f is 0 for even parity and 1 for odd parity. To find $p_2$, a similar XOR operation is performed by keeping two bits and dropping two bits as follows.

$$p_2 \oplus d_1 \oplus d_3 \oplus d_4 \oplus d_6 \oplus d_7 \ldots = f$$

Other parity bits are found in similar fashion.

In some instances, transmissions of data encoded with a Hamming code can result in long runs. For example, in an HC(127, 120) using even parity, if $d_k=0$ for $k=1, 2, \ldots, 120$, then $p_j=0$ for $j=1, 2, \ldots, 7$. Therefore, this sequence using even parity will have a run of 127 consecutive 0s (where toggle bit $b_T$ provides the interrupting 1). In addition if the toggle bit of the previous frame is 0, the run length will be 128. As another example in an HC(127, 120) using odd parity, $d_k=0$ for $k=1, 2, \ldots, 119$ and $d_{120}=1$, then $p_j=0$ for $j=1, 2, \ldots, 7$. Therefore, this sequence using odd parity will have a run of 126 consecutive 0s (where data bit $d_{120}$ provides the interrupting 1). In addition if the toggle bit of the previous frame is 0, the run length will be 127.

Embodiments of the present invention are directed to systems and methods using a modified error correction system based on a modified Hamming code (HC) in which the number of transitions in the output of the transmitter is increased or maximized (e.g., in which the maximum run length of data symbols is reduced).

Figure 3:
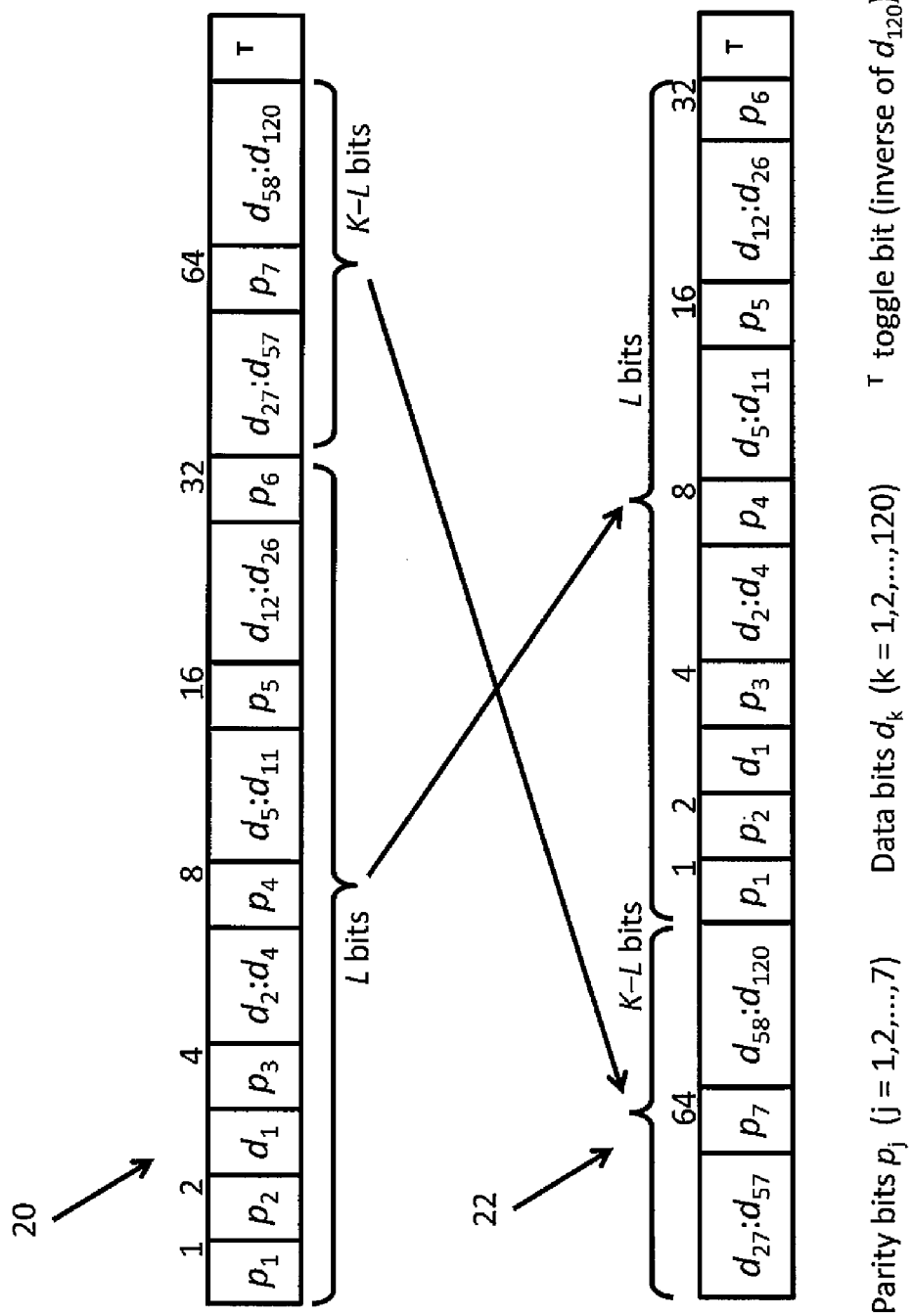
FIG. 3 schematically illustrates data encoded using a modified Hamming code according to one embodiment of the present invention.

FIG. 3 is a schematic illustration of generating modified output coded bits 22 of HC(127, 120) coded bits in accordance with one embodiment of the present invention. Referring to FIG. 3, the run length can be reduced by rearranging the original coded bits. For example, the first L bits of original coded bits 20 can be moved to the end of the sequence so that the modified coded bits 22 begins with the last K−L (K=M+N is the total number of bits in the frame) bits of the original coded bits 20. For the Hamming Code HC(127, 120), where K=127, L=32. In general, L is the number of bits prior (and including) the location of $p_{M-1}$. (In HC(127, 120) since M=7, $p_{M-1}=p_6$ which is at location 32 and so L=32.)

For example, when using odd parity, the parity bits can be computed in HC(127, 120) the usual way to generate coded bits 20. The first 32 bits of the output can then be moved to the end (e.g., $b_1, b_2, \ldots, b_{32}, b_{33}, \ldots, b_{127}$ ==> $b_{33}, \ldots, b_{127}, b_1, b_2, \ldots, b_{32}$) to generate modified output coded bits 22. (In some embodiments, the toggle bit is at the last location.) Using this technique, when $d_k=0$ for k=1, 2, ..., 120, a maximum run length of 95 bits can be achieved (e.g., $b_{33}$ through $b_{127}$ are ninety-five 0s, but $b_T$ is the inverse of $b_{127}$, so $b_T=1$), which is a reduction from the maximum run length of a standard HC(127, 120) of 126 bits.

Figure 4:
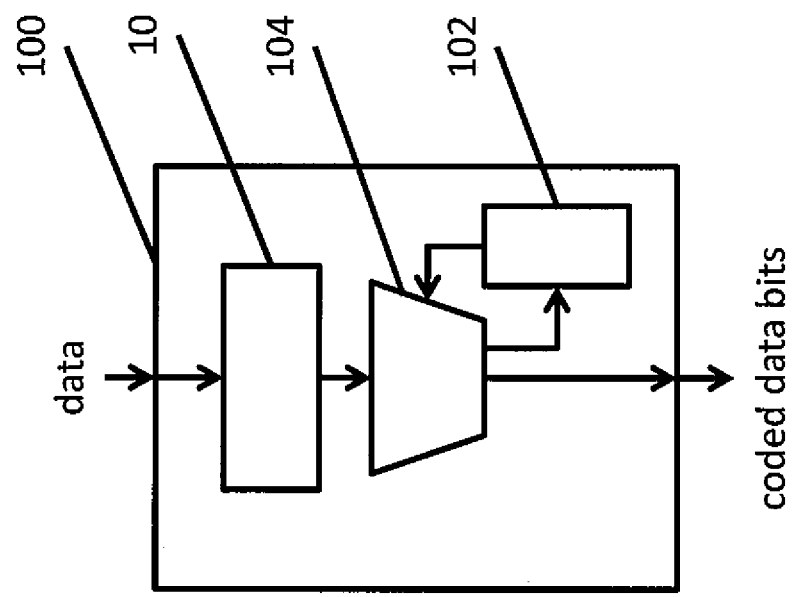
FIG. 4 is a block diagram illustrating a system configured to encode data using a modified Hamming code according to one embodiment of the present invention.

FIG. 4 is a schematic block diagram illustrating an encoding system or transmitting system (or transmitter) 100 configured to reduce the run length of transmitted data according to one embodiment of the present invention. The encoding system 100 includes a Hamming coder 10 (e.g., a suitable Hamming coder known to those skilled in the art) configured to receive data bits from an input, to perform a Hamming encoding operation on the received data bits, and to generate a Hamming coded output, a buffer 102 configured to store the first L bits of output from the Hamming coder (e.g., when using HC(127, 120), L=32), and a selector 104 configured to selectively store the first L bits the output of the Hamming coder 10 into the buffer 102, output the remaining bits after the first L bits (e.g., the next 96 bits when using HC(127, 120)), and output the stored L bits after outputting the remaining bits. For example, the selector 104 may include a counter to count the number of bits received from the Hamming coder 10 (or count a number of clock cycles) to determine when to save output bits in buffer 102 (e.g., the first 32 bits in HC(127, 120)), when to directly output the bits received from the Hamming coder 10 (e.g., the next 95 bits in HC(127, 120)), and when to output the stored bits (e.g., after outputting the 95 bits in HC(127, 120)). The various components of the block diagram of FIG. 4 may be implemented using, for example, a processor, an application specific integrated circuit (ASIC), a field programmable gate array (FPGA), and combinations thereof (e.g., different types of components implementing different parts of the block diagram).

Figure 5:
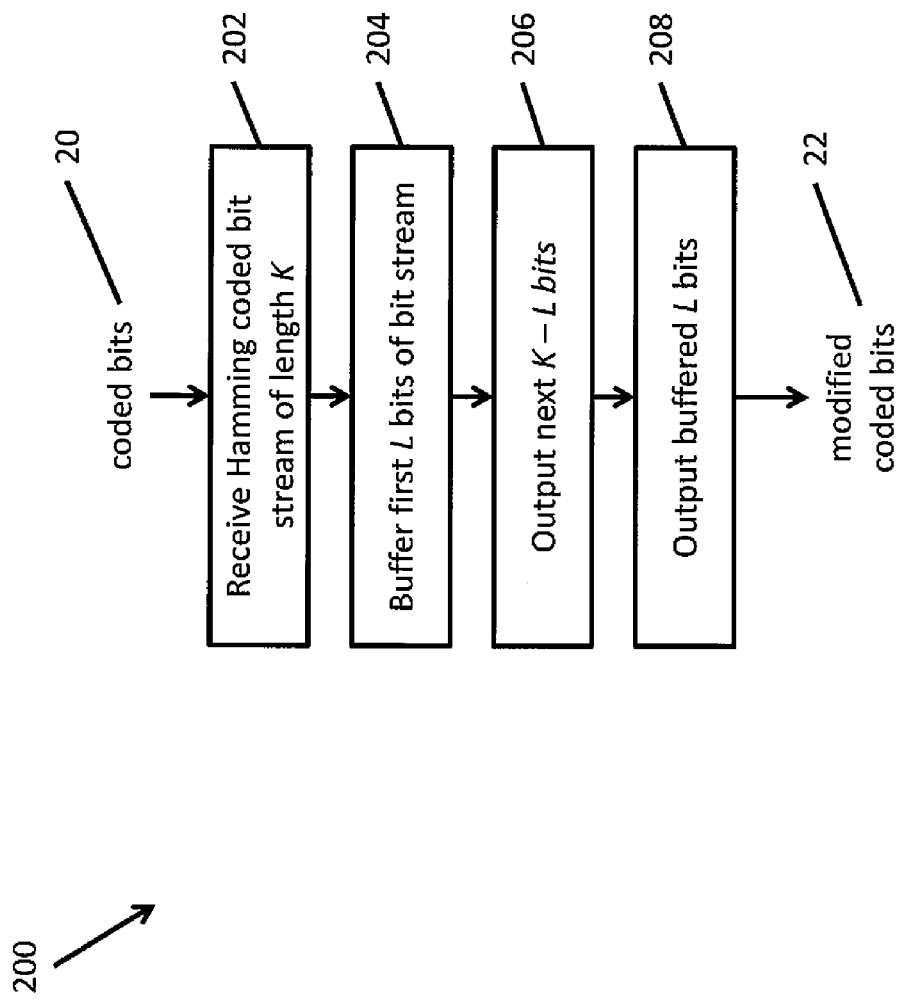
FIG. 5 is a flowchart of a method for encoding data according to one embodiment of the present invention.

FIG. 5 is a flow chart illustrating a method 200 for generating modified coded bits 22 from coded bits 20 according to one embodiment of the present invention, the modified coded bits 22 having a reduced run length. In operation 202, the Hamming coded bits 20 having length K are received from the Hamming coder 10, which performed a Hamming encoding operation on received data bits. The first L bits of the coded bits 20 are then buffered in the buffer 102 in operation 204. In operation 206, the next K−L bits of the coded bits 20 are then output as the first part of the modified coded bits 22, and, in operation 208, the L buffered bits are output as the second part of modified coded bits 22. The bits may be directly output or may be output to a second buffer before being output from the transmitter 100.

Figure 6:
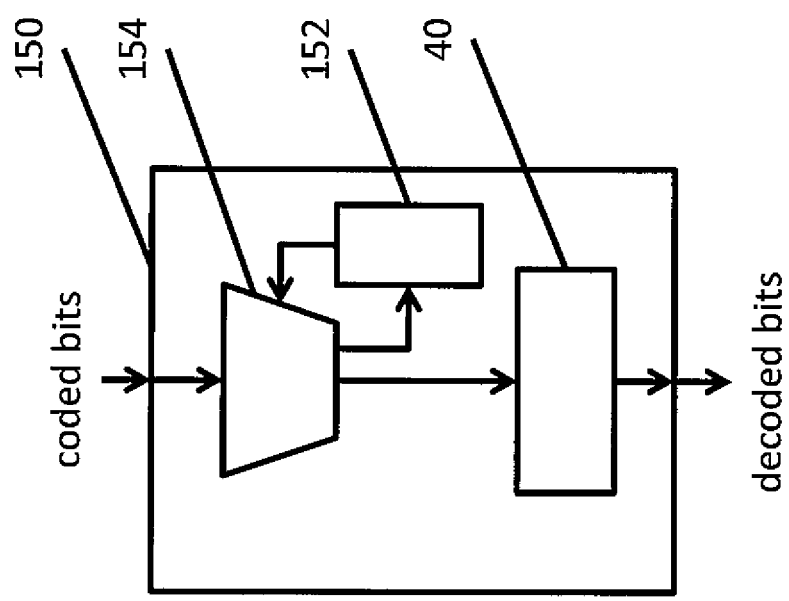
FIG. 6 is a block diagram illustrating a system configured to decode data using a modified Hamming code according to one embodiment of the present invention.

FIG. 6 is a block diagram illustrating a receiving system (or a receiver) 150 according to one embodiment of the present invention. The receiver 150 includes a selector 154 for identifying which bits to store in a buffer 152 and configured to output bits to a Hamming decoder 40, where the Hamming decoder 40 outputs decoded data.

Figure 7:
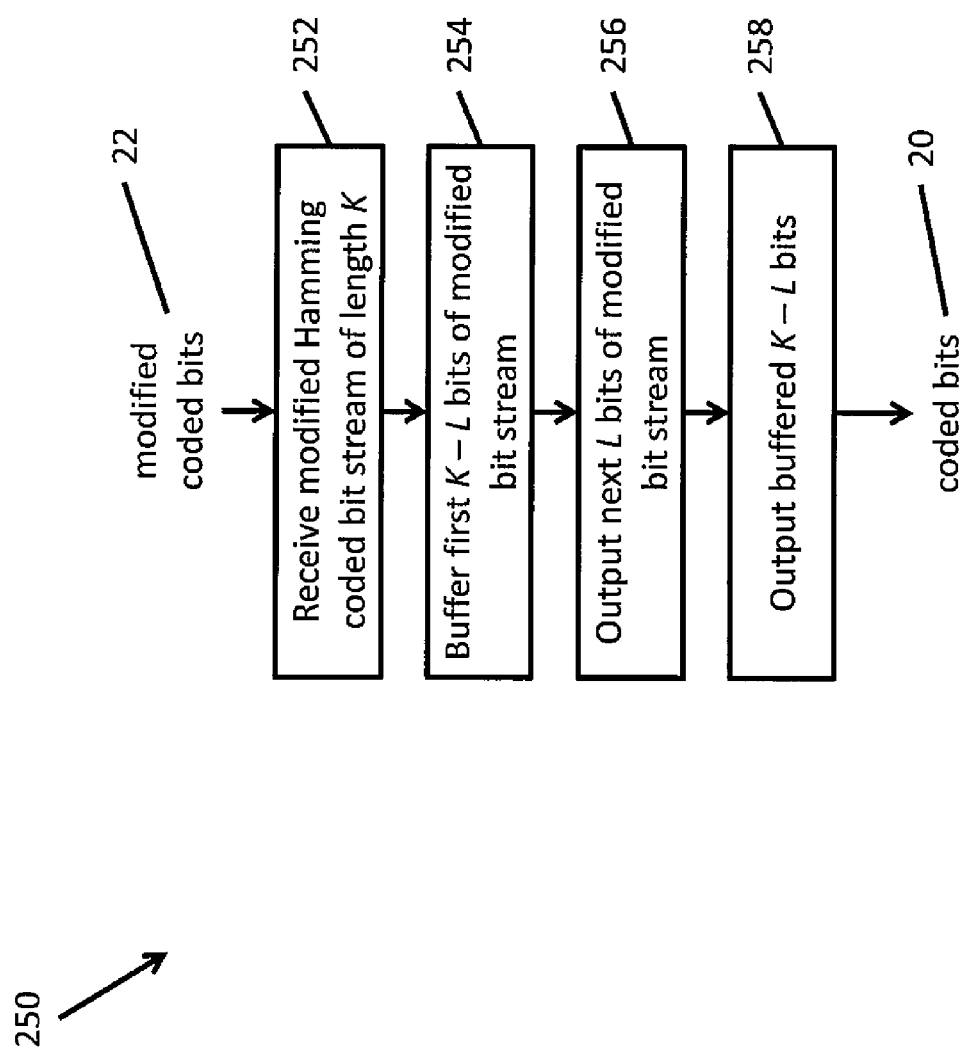
FIG. 7 is a flowchart of a method for decoding data according to one embodiment of the present invention.

FIG. 7 is a flowchart illustrating a method 250 for receiving and decoding modified coded bits 22 to recover original coded bits 20 according to one embodiment of the present invention. In operation 252, the modified coded bits of length K is received. The first K−L bits of the received modified coded bits are buffered in the buffer 152. The next L bits of the received modified coded bits are then output in operation 256, followed by the buffered K−L bits in operation 258. The output bits may be buffered before being supplied to the Hamming decoder 40 to perform a Hamming decoding operation.

According to another embodiment of the present invention, the maximum run length is reduced or minimized by using different parity types (e.g., odd versus even) for the last two parity bits. In other words, in a Hamming code using a sequence of M parity bits, the last (or ultimate) parity bit $p_M$ of the sequence of parity bits is computed using a first parity and the second to last (or penultimate) parity bit $p_{M-1}$ of the sequence of parity bits is computed using a second parity different from the first parity. FIG. 8A is a schematic diagram illustrating modified output coded bits 24 of HC(127, 120) coded bits in accordance with one embodiment of the present invention where the ultimate parity bit $p_M$ (in this case, $p_7$) is computed using odd parity (e.g., $p_7$=the XOR of bits $d_{58}$ though $d_{120}$ plus 1 or, more concisely, $p_7$ XOR($d_{58}$:$d_{120}$)⊕1) and penultimate parity bit $p_{M-1}$ (in this case, $p_6$) is computed using even parity (e.g., $p_6$=the XOR of bits $d_{27}$ through $d_{57}$ and bits $d_{89}$ through $d_{120}$, or more concisely, $p_6$=XOR($d_{27}$:$d_{57}$, $d_{89}$:$d_{120}$)). By computing the parity bits of the modified coded bits using a mixture of even and odd parity, a maximum run length of 94 bits can be achieved.

FIG. 8B is a schematic diagram illustrating modified coded bits 24 of HC(127, 120) coded bits in accordance with yet another embodiment of the present invention in which ultimate parity bit $p_M$ (in this case, $p_7$) of the sequence of parity bits is computed using even parity (e.g., $p_7$ XOR($d_{58}$:$d_{120}$)) and penultimate parity bit $p_{M-1}$ (in this case, $p_6$) of the sequence of parity bits is computed using odd parity (e.g., $p_6$=XOR($d_{27}$:$d_{57}$, $d_{89}$:$d_{120}$)⊕1). By computing the sequence of parity bits of the modified coded bits using a mixture of even an odd parity, a maximum run length of 94 bits can be achieved.

According to embodiments of the present invention, the other parity bits $p_1$ to $p_{M-2}$ (e.g., $p_1$ to $p_5$) of the sequence of parity bits may have even parity or odd parity. Different parity bits of parity bits $p_1$ to $p_{M-2}$ may be computed with different (even or odd) parity.

Figure 9:
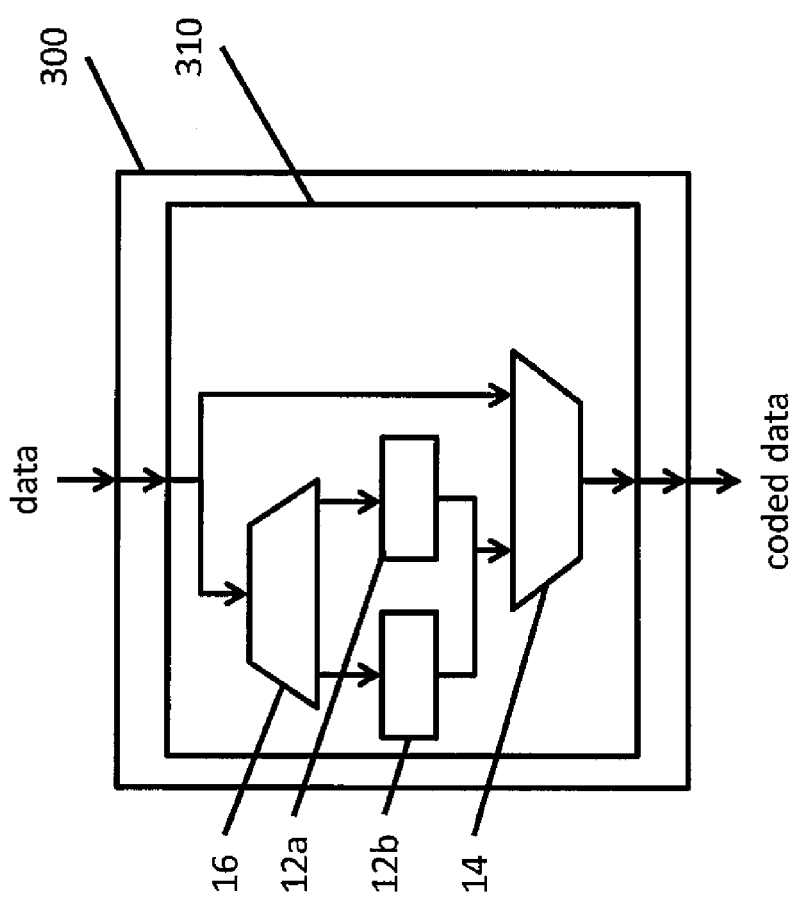
FIG. 9 is a block diagram illustrating a system configured to encode data using a modified hamming code according to an additional embodiment of the present invention.

FIG. 9 is a schematic block diagram illustrating a transmitter 300 configured to output modified Hamming coded bits 24 or 26 according to one embodiment of the present invention. The system 300 includes a modified Hamming coder 310 configured to compute a modified Hamming code, the modified Hamming coder 310 including a parity selector 16, a first parity generator 12a, second parity generator 12b, and a multiplexer 14. In one embodiment, the first parity generator and the second parity generator are configured to compute even parity and odd parity (or perform a Hamming encoding operation), respectively. The parity selector 16 identifies and supplies data bits of the input data to the first parity generator and the second parity generator in accordance with the data bits needed to calculate particular parity bits.

For example, in an embodiment in which parity bit $p_7$ is computed using odd parity and parity bit $p_6$ is computed using even parity, the parity selector 16 supplies data bits $d_{58}:d_{120}$ to the second parity generator 12b (which is configured to compute odd parity) for computing $p_7$ and supplies data bits $d_{27}:d_{57}$ and $d_{89}:d_{120}$ to the first parity generator 12a to compute parity bit $p_6$.

Figure 10:
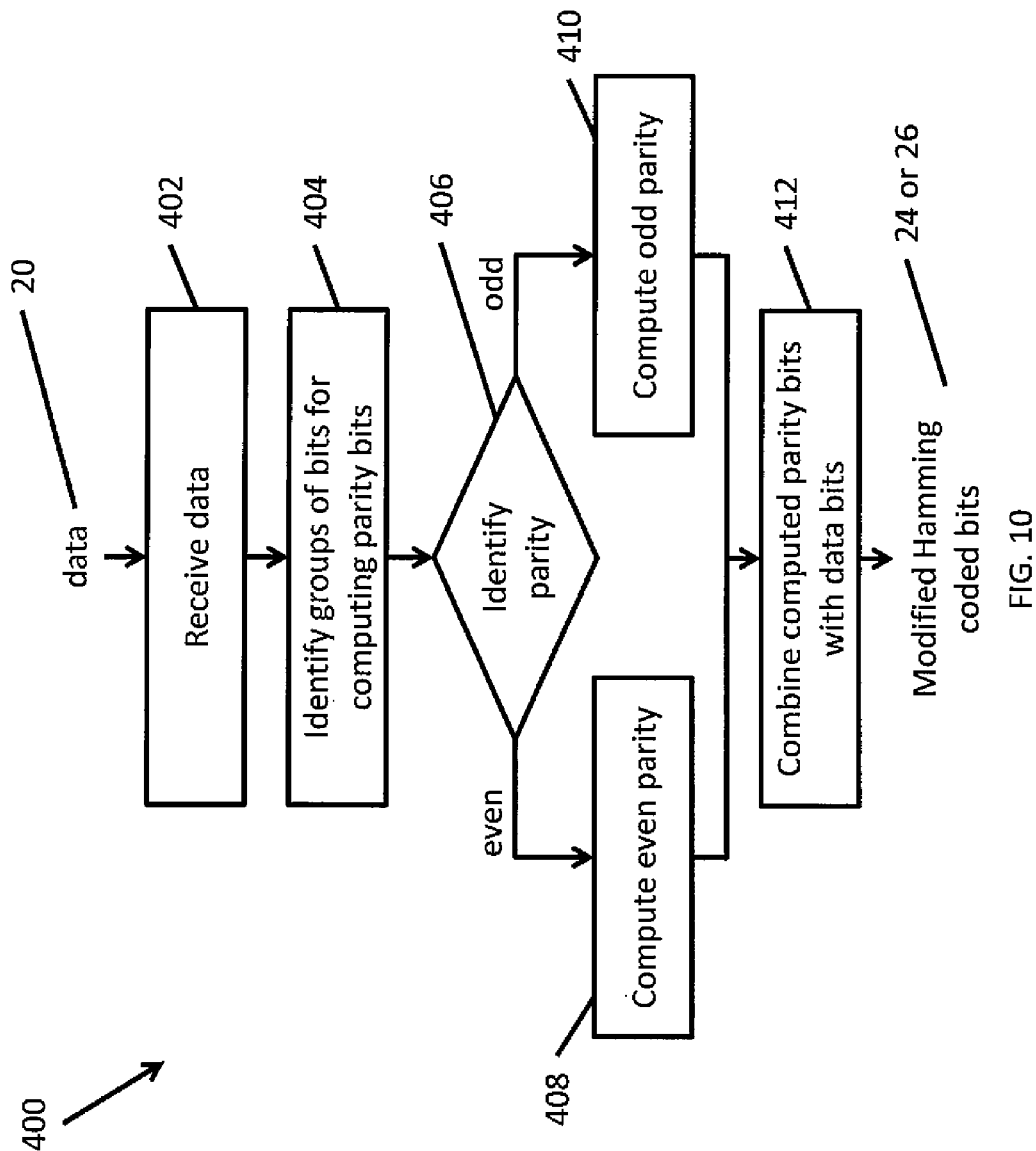
FIG. 10 is a flowchart of a method for encoding data according to another embodiment of the present invention.

FIG. 10 is a flow chart illustrating a method for computing modified Hamming coded bits from input data. In operation 402, data 20 is received (e.g., from a device or a component outputting data to be sent over a serial link). In operation 404, groups of bits are identified for computing the parity bits. For example, in HC(127, 120), bits $d_{58}:d_{120}$ are identified as being associated with the parity bit $p_7$ and data bits $d_{27}:d_{57}$ and $d_{89}:d_{120}$ are identified as being used to compute the parity bit $p_6$. In operation 406, the parity of the particular parity bit being computed is identified as being even or odd. For example, in one embodiment, $p_6$ is computed using even parity and $p_7$ is computed using odd parity. Based on the identified parity being used for a particular parity bit, the data bits corresponding to that parity bit are computed using even parity in operation 408 or odd parity in operation 410. For example, when the parity bit $p_6$ is computed using even parity, data bits $d_{27}:d_{57}$ and $d_{89}:d_{120}$ are used to compute the value of the parity bit $p_6$ in operation 408. In operation 412, the computed parity bits are combined (or interleaved) with the data bits 20 in the output modified Hamming coded bits 24 or 26 (e.g., parity bit $p_a$ is located at position $2^{a-1}$).

Figure 11:
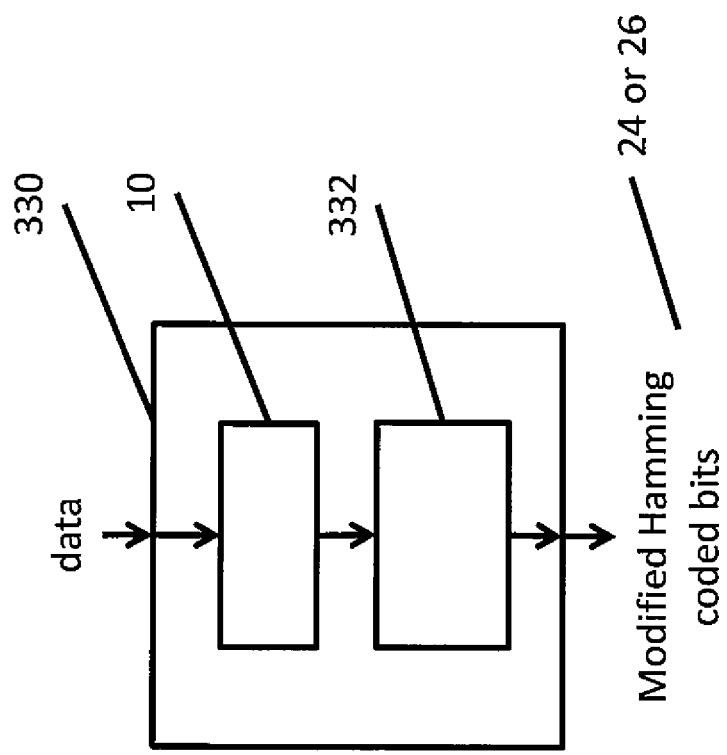
FIG. 11 is a schematic block diagram illustrating a transmitter configured to output modified Hamming coded bits according to one embodiment of the present invention.

FIG. 11 is a schematic block diagram illustrating a transmitter 330 configured to output modified Hamming coded bits 24 or 26 according to another embodiment of the present invention. The system 330 includes a standard Hamming coder 10 configured to compute a standard Hamming encoding operation (e.g., compute a set of M parity bits p given a set of input data bits d), in which the last two parity bits $p_{M-1}$ and $p_M$ are computed using the same parity (e.g., both are computed using even parity or both are computed using odd parity). The system 330 further includes a parity bit modifier 332 (or transmit parity bit modifier), which is configured to modify the parity of the penultimate parity bit $p_{M-1}$ (e.g., from even to odd or from odd to even) by computing the XOR of $p_{M-1}$ and 1 (e.g., setting the penultimate parity bit to $p_{M-1} \oplus 1$). The modified bit stream is then output as modified Hamming coded bits 24 or 26.

According to other embodiments of the present invention, the parity bit modifier 332 is configured to modify the parity of the ultimate parity bit $p_M$ by computing the XOR of $p_M$ and 1 (e.g., setting the ultimate parity bit to $p_M \oplus 1$).

Figure 12:
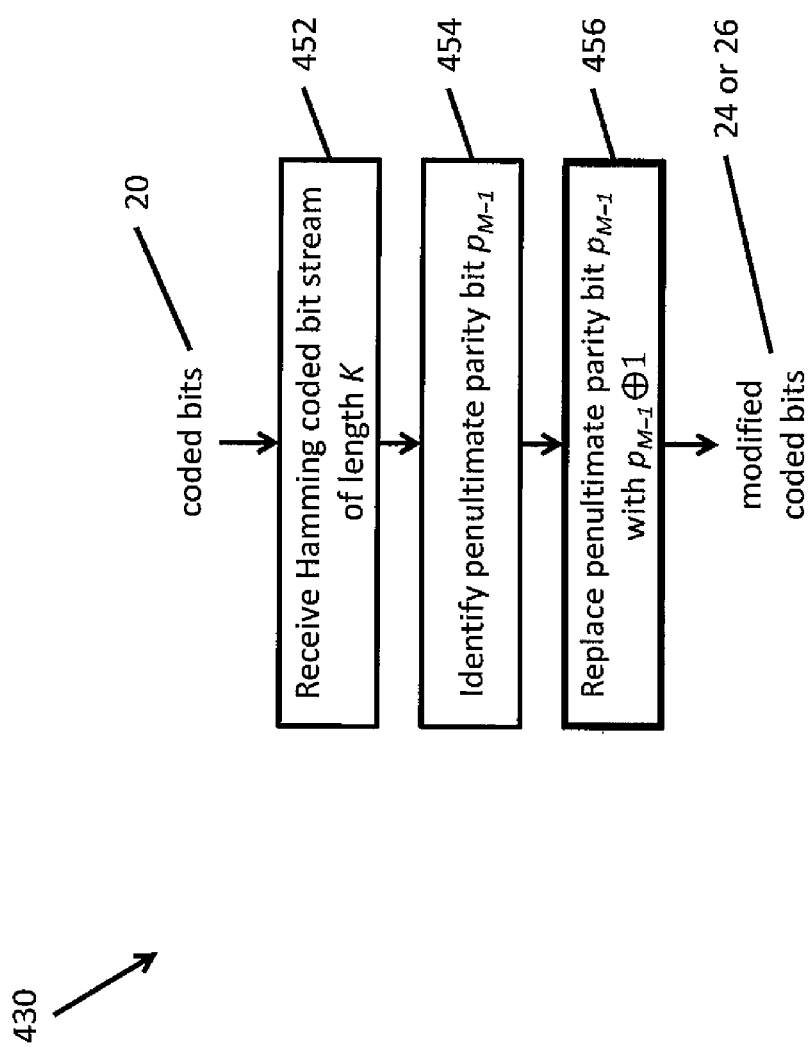
FIG. 12 is a flow chart illustrating a method for computing modified Hamming coded bits from input data according to one embodiment of the present invention.

FIG. 12 is a flow chart illustrating a method 430 for computing modified Hamming coded bits from input data according to another embodiment of the present invention. In operation 432 a Hamming coded bit stream of length K including M parity bits p and N data bits d is received. In operation 434 the penultimate parity bit $p_{M-1}$ is identified, and, in operation 436, the penultimate parity bit $p_{M-1}$ is inverted or replaced with $p_{M-1} \oplus 1$ (in other words, its value is toggled or inverted from 0 to 1 or from 1 to 0). The modified Hamming coded bits with the inverted penultimate parity bit is then output as modified coded bits 24 or 26.

In other embodiments of the present invention, in operation 434, the ultimate parity bit $p_M$ is identified, and, in operation 436, the ultimate parity bit $p_M$ is inverted or replaced with $p_M \oplus 1$.

Figure 13:
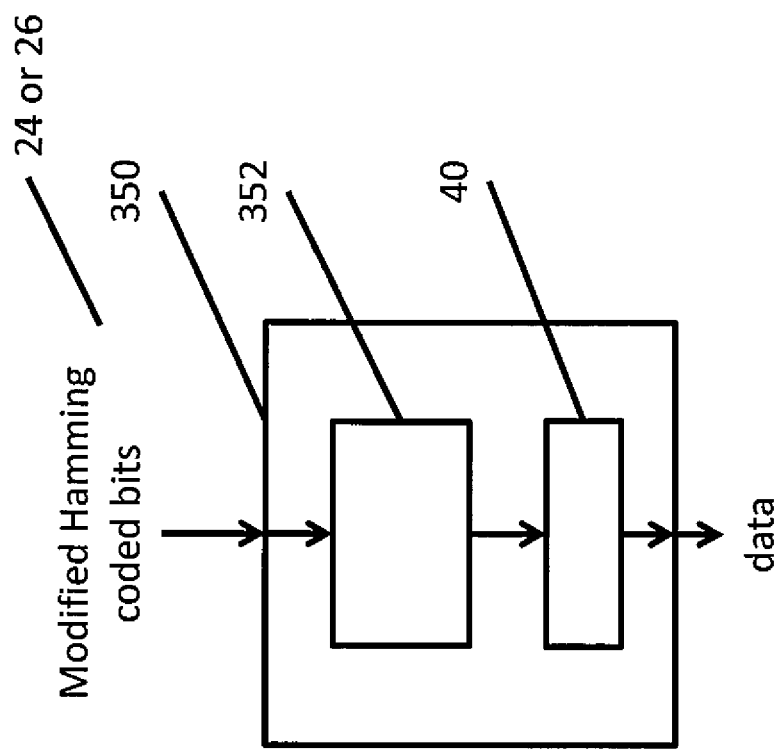
FIG. 13 is a block diagram illustrating a receiver configured to receive modified Hamming coded bits according to one embodiment of the present invention.

FIG. 13 is a block diagram illustrating a receiver according to one embodiment of the present invention. Referring to FIG. 13, the receive system 350 includes a receive parity bit modifier 352 configured to modify the parity of the penultimate parity bit $p_{M-1}$ (e.g., from even to odd or from odd to even) by computing the XOR of $p_{M-1}$ and 1 (e.g., setting the penultimate parity bit to $p_{M-1} \oplus 1$). The receive parity bit modifier 352 then supplies the bit stream to a standard Hamming decoder 40, which decodes the stream to generate decoded data. In some embodiments, the ultimate parity $p_M$ is inverted instead of the penultimate parity bit $p_{M-1}$.

Figure 14:
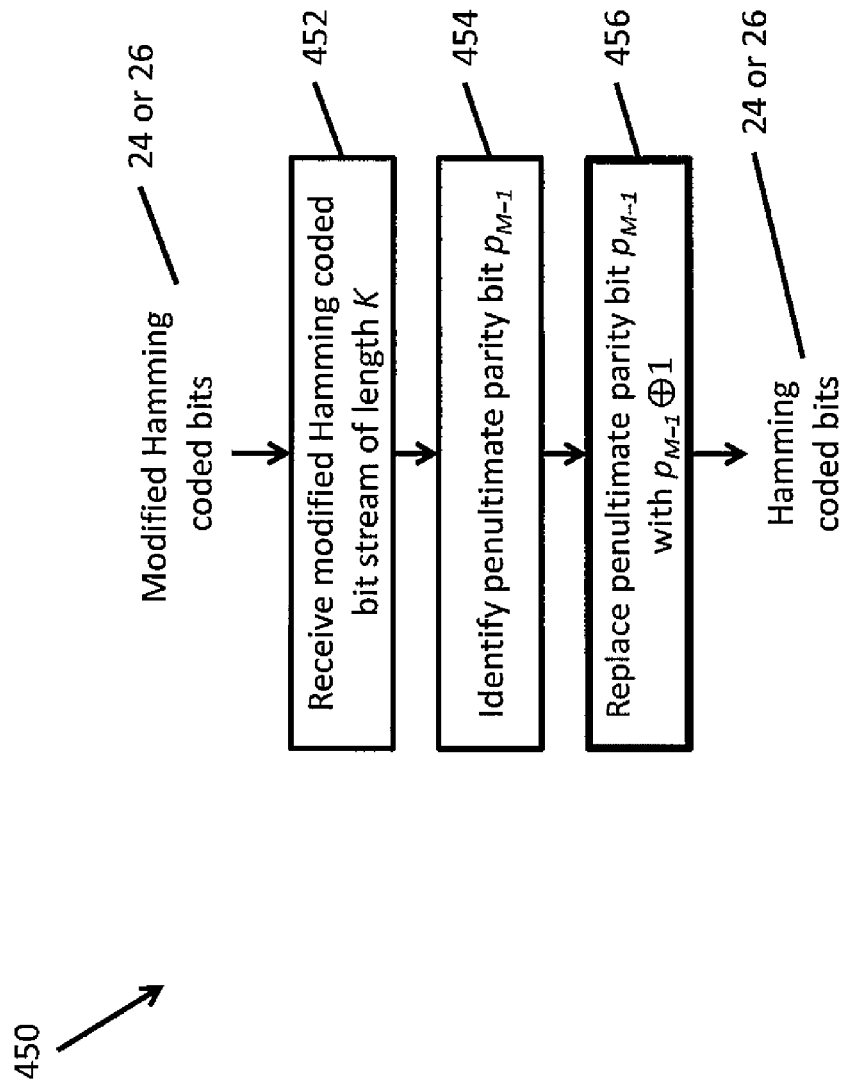
FIG. 14 is a flowchart illustrating a method for decoding bits in a modified Hamming code according to one embodiment of the present invention.

FIG. 14 is a flowchart illustrating a method 450 for decoding bits in a modified Hamming code according to one embodiment of the present invention. In operation 452, a modified Hamming coded bit stream of length K is received. The penultimate parity bit $p_{M-1}$ is identified in operation 454 and is inverted or replaced with the value of the XOR of $p_{M-1}$ and 1 (e.g., setting the penultimate parity bit to $p_{M-1} \oplus 1$) in operation 456. The result of this operation is to restore a standard Hamming coded bit stream 24 or 26 that can be supplied to a standard Hamming decoder. In some embodiments, the ultimate parity $p_M$ is modified instead of the penultimate parity bit $p_{M-1}$.

A proof that a reduction of run length can be achieved by mixing odd and even parities can be found in the Appendix "Reduction of Run Length by mixing Odd and Even Parities in Hamming Code," filed in the United States Patent and Trademark Office with the present application. The entirety of the Appendix is incorporated herein by reference.

Embodiments of the present invention can be implemented in a variety of ways as would be appreciated by a person of ordinary skill in the art, and the term "processor" as used herein may refer to any computing device capable of performing the described operations, such as a programmed general purpose processor (e.g., an ARM processor) with instructions stored in memory connected to the general purpose processor, a field programmable gate array (FPGA), and a custom application specific integrated circuit (ASIC). Embodiments of the present invention can be integrated into a serial communications controller (e.g., a universal serial bus or USB controller), a graphical processing unit (GPU), an intra-panel interface, and other hardware or software systems using Hamming coded signals.

While the present invention has been described in connection with certain example embodiments, it is to be understood that the invention is not limited to the disclosed embodiments, but, on the contrary, is intended to cover various modifications and equivalent arrangements included within the spirit and scope of the appended claims.

What is claimed is:
1. A method for encoding data, the method comprising:
  computing a plurality of parity bits using a Hamming encoding operation on a plurality of data bits, a first parity bit of the parity bits being computed using even party and a second parity bit of the parity bits being computed using odd parity; and
  outputting the data bits and the computed parity bits sequentially to a serial link, the computed parity bits being interleaved with the data bits, wherein the first parity bit is sequentially output before the second parity bit, wherein a first sequence of the data bits is sequentially output between the first parity bit and the second parity bit, wherein a second sequence of the data bits is sequentially output after the second parity bit, and wherein the number of data bits in the second sequence is greater than the number of data bits in the first sequence.

2. The method of claim 1, wherein the second parity bit is the last parity bit in sequence of the plurality of parity bits.

3. The method of claim 1, wherein the first parity bit is second to the last parity bit in sequence of the plurality of parity bits.

4. The method of claim 1, wherein the Hamming encoding operation corresponds to HC(127, 120), the first parity bit is the 6th parity bit and the second parity bit is the 7th parity bit.

5. The method of claim 1, wherein each of the parity bits is located at a corresponding position in the sequence of parity bits interleaved with data bits, wherein the corresponding position is a power of two.

6. An encoder comprising:

an input configured to receive a plurality of data bits;

a processor configured to encode the data bits utilizing a Hamming encoding operation to generate a plurality of coded bits; and an output configured to output the plurality of coded bits sequentially to a serial link, wherein the processor is configured to reduce a maximum run length of the plurality of coded bits in comparison to coded bits corresponding to standard Hamming code, wherein the processor is configured to compute a plurality of parity bits utilizing the Hamming encoding operation on the plurality of data bits, a first parity bit of the parity bits being computed utilizing even parity and a second parity bit of the parity bits being computed utilizing odd parity, wherein the coded bits comprise the parity bits interleaved with the data bits, wherein the output is configured to output, sequentially, the first parity bit before the second parity bit, wherein the output is configured to output, sequentially, a first sequence of the data bits between the first parity bit and the second parity bit, wherein the output is configured to output, sequentially, a second sequence of the data bits after the second parity bit, and wherein the number of data bits in the second sequence is greater than the number of data bits in the first sequence.

7. The encoder of claim 6, wherein the processor is configured to rearrange the plurality of coded bits to reduce the maximum run length of the plurality of coded bits.

8. The encoder of claim 7, wherein the plurality of coded bits is rearranged by moving a number of the plurality of coded bits at the beginning to a position after a last one of the coded bits.

9. The encoder of claim 8, wherein the Hamming encoding operation corresponds to HC(127, 120), and the number of the plurality of coded bits at the beginning comprises 32 bits.

10. A decoder comprising:

an input configured to receive, sequentially over a serial link, a plurality of coded bits comprising a plurality of data bits and a plurality of parity bits;

a processor configured to:

modify received coded bits to generate a plurality of Hamming coded bits, the received coded bits comprising a first parity bit and a second parity bit interleaved with a plurality of data bits; and decode the Hamming coded bits utilizing a Hamming decoding operation to generate a plurality of decoded bits, the first parity bit being decoded as an even parity bit and the second parity bit being decoded as an odd parity bit; and an output configured to output the plurality of decoded bits, wherein the received plurality of coded bits has a reduced run length in comparison to coded bits corresponding to standard Hamming code, wherein the input is configured to receive, sequentially, the first parity bit before the second parity bit, wherein the input is configured to receive, sequentially, a first sequence of the data bits between the first parity bit and the second parity bit, wherein the input is configured to receive, sequentially, a second sequence of the data bits after the second parity bit, and wherein the number of data bits in the second sequence is greater than the number of data bits in the first sequence.

11. The decoder of claim 10, wherein the processor is configured to modify the received coded bits by rearranging the plurality of received coded bits by moving a number of the plurality of coded bits at the beginning to a position after a last one of the coded bits.

12. The decoder of claim 10, wherein the processor is configured to modify the received coded bits by toggling the value of a parity bit of the parity bits.

13. A communication system comprising:

a data source;

a serial link;

an encoder coupled between the data source and the serial link, comprising:

an input configured to receive a plurality of bits from the data source;

a processor configured to encode the bits utilizing a Hamming encoding operation to generate a plurality of coded bits; and an output configured to output the plurality of coded bits sequentially to the serial link, wherein the processor is configured to reduce a maximum run length of the plurality of coded bits in comparison to coded bits corresponding to standard Hamming code, and wherein the processor is configured to compute a plurality of parity bits utilizing the Hamming encoding operation on the plurality of bits, a first parity bit of the parity bits being computed utilizing even parity and a second parity bit of the parity bits being computed utilizing odd parity, wherein the coded bits comprise the parity bits interleaved with the data bits, wherein the output is configured to output, sequentially, the first parity bit before the second parity bit, wherein the output is configured to output, sequentially, a first sequence of the data bits between the first parity bit and the second parity bit, wherein the output is configured to output, sequentially, a second sequence of the data bits after the second parity bit, and wherein the number of data bits in the second sequence is greater than the number of data bits in the first sequence.

14. The communication system of claim 13, wherein the processor is configured to rearrange the plurality of coded bits to reduce the maximum run length of the plurality of coded bits by moving a number of the plurality of coded bits at the beginning to a position after a last one of the coded bits.

* * * * *